United States Patent [19]
Murai et al.

[11] Patent Number: 5,042,784
[45] Date of Patent: Aug. 27, 1991

[54] DAMPING SUPPORT STRUCTURE

[75] Inventors: Nobuyoshi Murai, Sakai; Yoshinori Takahashi, Tondabayashi; Kazuyoshi Katayama, Nishinomiya; Masashi Yasuda, Suita; Atsuhiko Mori, Ibaraki, all of Japan

[73] Assignees: Takenaka Corporation, Osaka; Tokyo Kiki Kabushiki Kaisha, Amagasaki, both of Japan

[21] Appl. No.: 376,982

[22] Filed: Jul. 7, 1989

[30] Foreign Application Priority Data

Jul. 11, 1988 [JP] Japan ................................ 63-172384
Jul. 11, 1988 [JP] Japan ................................ 63-172385
Jul. 11, 1988 [JP] Japan ................................ 63-172386

[51] Int. Cl.$^5$ ...................... F16M 1/00; F16M 13/00
[52] U.S. Cl. ..................................... 267/136; 248/550
[58] Field of Search ............... 267/136; 188/378–380, 188/298; 248/550, 636, 638; 73/664; 360/137

[56] References Cited

U.S. PATENT DOCUMENTS

| 3,889,936 | 6/1975 | Shimizu . | |
|---|---|---|---|
| 3,917,201 | 11/1975 | Roll | 248/550 |
| 4,713,714 | 12/1987 | Gatti et al. | 248/638 X |
| 4,730,541 | 3/1988 | Greene | 248/550 X |
| 4,735,296 | 4/1988 | Pinson | 188/379 |
| 4,795,123 | 1/1989 | Forward et al. | 188/378 X |

FOREIGN PATENT DOCUMENTS

| 2604809 | 8/1977 | Fed. Rep. of Germany . |
| 3718630 | 12/1987 | Fed. Rep. of Germany . |
| 60-168933 | 2/1985 | Japan . |
| 7311944 | 3/1974 | Netherlands . |
| 8500208 | 1/1985 | PCT Int'l Appl. . |

Primary Examiner—Robert J. Oberleitner
Attorney, Agent, or Firm—Oblon, Spivak, McClelland, Maier & Neustadt

[57] ABSTRACT

A damping support structure for preventing vibrations of an apparatus table supporting an apparatus for manufacturing ultra-high precision devices such as semiconductors and printed circuit boards. The apparatus table is supported in suspension by support members, with its apparatus mounting surface disposed at a low level. The support members are supported by stationary members through vertically extendible and contractible first air springs. Horizontally extendible and contractible second air springs are disposed between the stationary members and the apparatus table. The first and second air springs serve to mitigate vertical and horizontal vibrations of the apparatus table, respectively. At the same time, in response to vibrations of the apparatus table detected by vibration sensors, air supply from air supply devices to inside spaces of the first and second air springs is controlled to apply controlling forces to the apparatus table through the first and second air springs for displacing the apparatus table relative to the stationary members and maintaining the apparatus table in an absolutely stationary state.

4 Claims, 8 Drawing Sheets

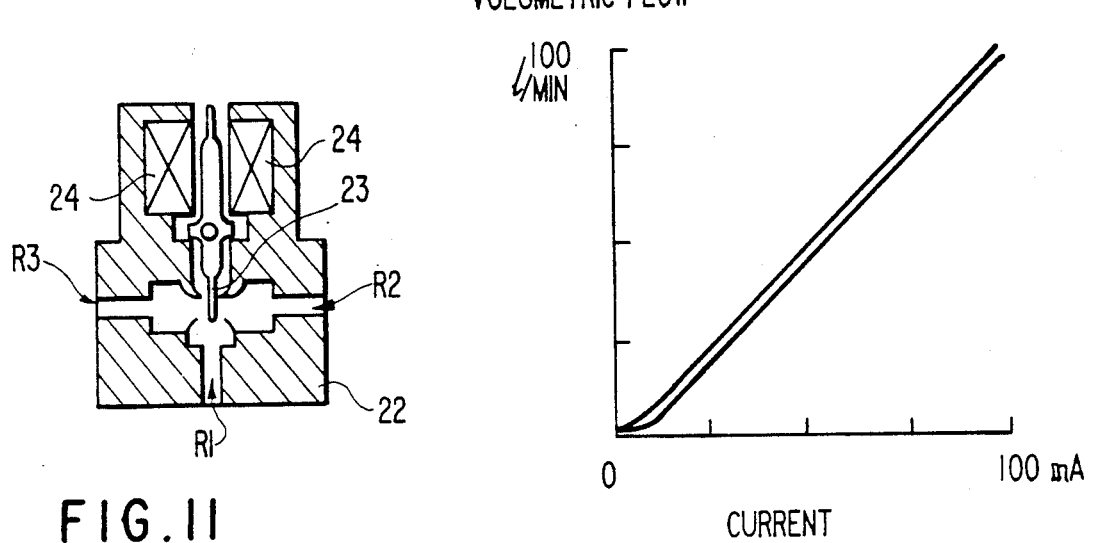
FIG.11
FIG.12
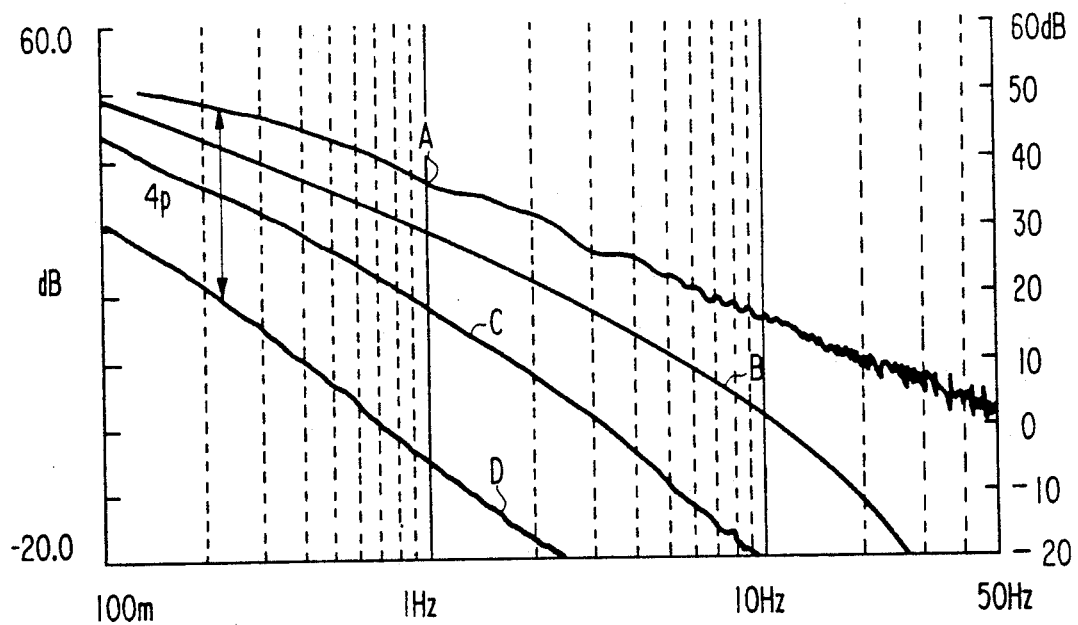
FIG.13

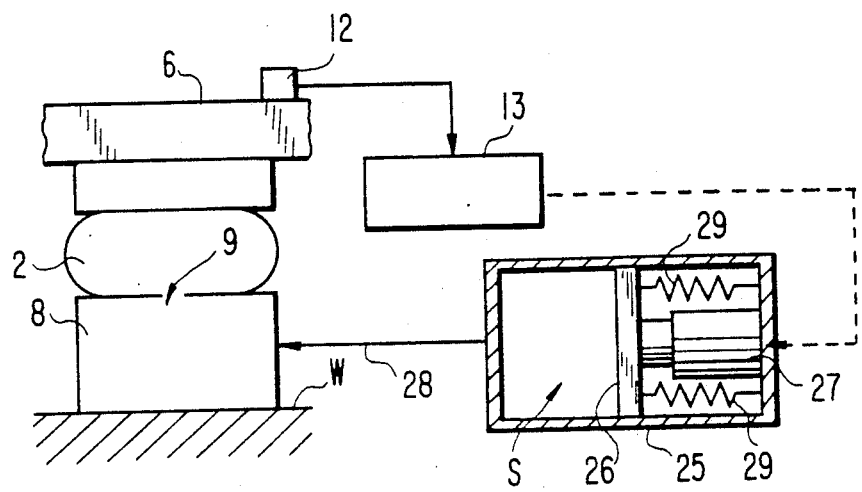
FIG.14
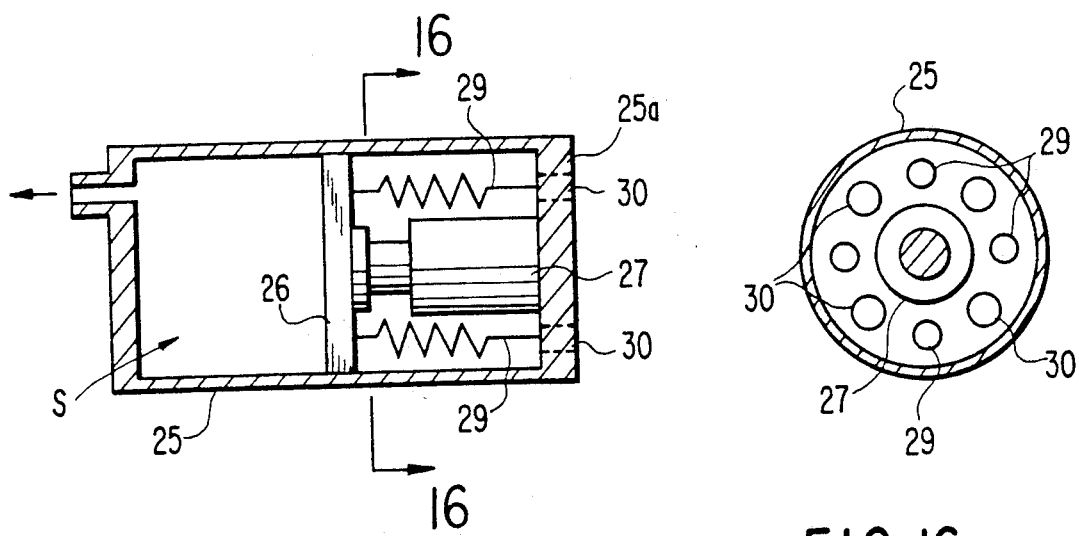
FIG.15
FIG.16

DAMPING SUPPORT STRUCTURE

BACKGROUND OF THE INVENTION (1) Field of the Invention

The present invention relates to damping support structures for preventing horizontal and vertical vibrations of manufacturing apparatus. Such a support structure is installed in an LSI manufacturing plant, a laser appliance manufacturing plant or the like to support apparatus for manufacturing ultra-high precision devices such as semiconductors and printed circuit boards. The support structure absorbs vibrations due to earthquakes or microvibrations due to running vehicles through a floor or other base structure, thereby preventing vibrations of a table supporting the manufacturing apparatus.

(2) Description of the Prior Art

At the LSI manufacturing plant, laser appliance manufacturing plant and the like, it is necessary to suppress microvibrations since even microvibrations result in defective products. A conventional damping support structure includes spring elements such as laminated rubber layers and air springs arranged at four peripheral positions between a table on which a manufacturing apparatus is mounted and the floor or other base structure. These spring elements elastically support the apparatus table, with the air springs in particular efficiently absorbing microvibrations, while mitigating shocks due to vibrations. This damping support structure further includes actuators such as linear motors arranged between the apparatus table and the base structure, and at different positions to the spring elements. Controls are provided through the actuators in response to vibrations of the apparatus table, thereby to check the apparatus table vibrations.

In the conventional support structure, however, the spring elements for mitigating shocks due to vibrations and the actuators for applying the controls comprise separate components disposed at different positions. This construction requires many troublesome steps in assembling the apparatus table and the support structure together. Further, spaces must be secured between the apparatus table and the base structure for accommodating those components, which results in the disadvantage of the entire damping structure becoming large.

SUMMARY OF THE INVENTION

An object of the present invention is to provide a compact damping support structure capable of effectively suppressing transmission to the base structure and to the apparatus table supported thereon of vibrations due to earthquakes and microvibrations due to running vehicles and the like, with two-dimensional horizontal vibrations being mitigated and checked by means of a compact construction, and with vertical vibrations being effectively mitigated and checked by means of elastic support and controls applied to the apparatus table.

Another object of the invention is to provide a damping support structure capable of adjusting internal pressure of air springs economically and with excellent environmental performances, i.e. producing little or no noise or dust.

A further object of the invention is to provide a support structure capable of reliably mitigating and controlling vibrations of the apparatus table, and yet effectively applying supports and controls to the apparatus table regardless of its configuration.

In order to achieve these objects, the present invention provides a damping support structure having stationary members, an apparatus table, and air springs disposed between the stationary member and the apparatus table for elastically supporting the apparatus table, the damping support structure comprising support members supported by the stationary members through vertically extendible and contractible first air springs, the support members supporting the apparatus table in suspension to be displaceable horizontally, with support positions of the first air springs disposed above an apparatus mounting surface of the apparatus table, horizontally extendible and contractible second air springs disposed between the stationary members and the apparatus table, air supply means communicating with inside spaces of the first and second air springs, respectively, vibration sensors attached to the apparatus table, and control means operable in response to detections provided by the vibration sensors to control air supply from the air supply means to the inside spaces of the first and second air springs for counteracting vibrations of the apparatus table.

In the above construction, the first and second air springs are disposed between the stationary members and support members and between the stationary members and apparatus table, respectively. The first and second air springs elastically support the apparatus table to mitigate horizontal and vertical vibrations. At the same time, air supply to inside spaces of the first and second air springs is controlled to apply control forces to the apparatus table through these air springs. Thus, vibrations of the apparatus table are mitigated and controlled.

Since the air springs elastically supporting the apparatus table are used to apply control forces to the apparatus table, which is effected by controlling the air supply to the inside spaces of the air springs, assembly steps are significantly reduced as compared with the case of assembling the first and second air springs and actuators in independent steps. Further, this construction requires a reduced installation space, which allows the damping support structure to be compact.

In the above construction, the apparatus table is suspended from the support members through suspenders, with support positions of the first air springs located above the apparatus mounting surface. Consequently, when various apparatus are placed on the apparatus table, the center of gravity of the entire vibrating system may be at a vertically close level with the support positions of the air springs. This assures a vertically well-balanced support of the entire vibrating system, and enables the control forces to be applied effectively. The vertical vibrations of the apparatus table are thus mitigated and controlled reliably.

Other features and advantages of the present invention will be apparent from the following description.

BRIEF DESCRIPTION OF THE DRAWINGS

FIG. 11 is a view in vertical section of a servo valve, FIG. 12 is a graph showing a relationship between electric current and volumetric flow, FIG. 13 is a graph showing pressure variations of two air tanks communicating with each other through an orifice pipe, FIG. 14 is a schematic front view, partly broken away, of an air supply device according to another embodiment of the present invention, FIG. 15 is a partly sectional enlarged view of a principal portion of the air supply device shown in FIG. 14, FIG. 16 is a section taken on line XVI—XVI of FIG. 15.

DESCRIPTION OF THE PREFERRED EMBODIMENTS

Figure 1:
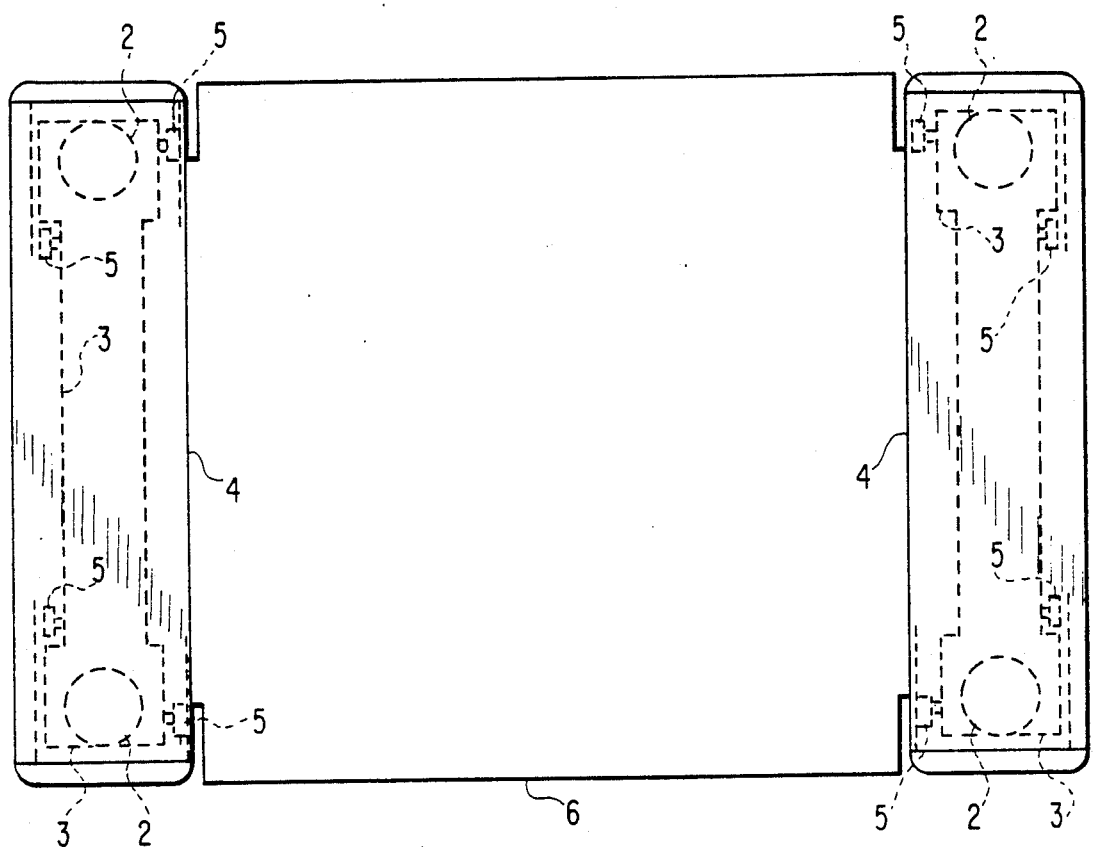
FIG. 1 is a plan view of an entire damping support structure according to the present invention.
Figure 2:
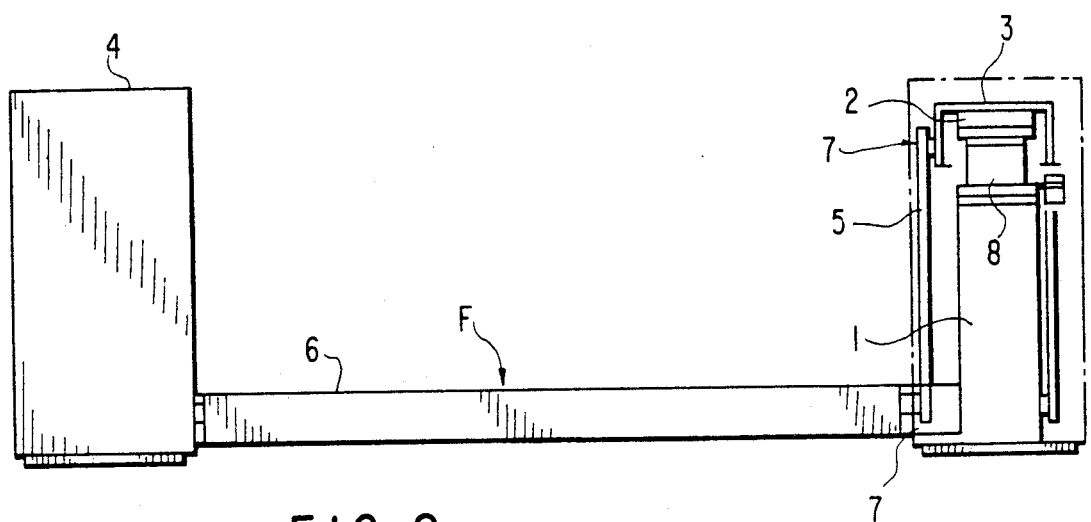
FIG. 2 is a front view of the support structure.
Figure 3:
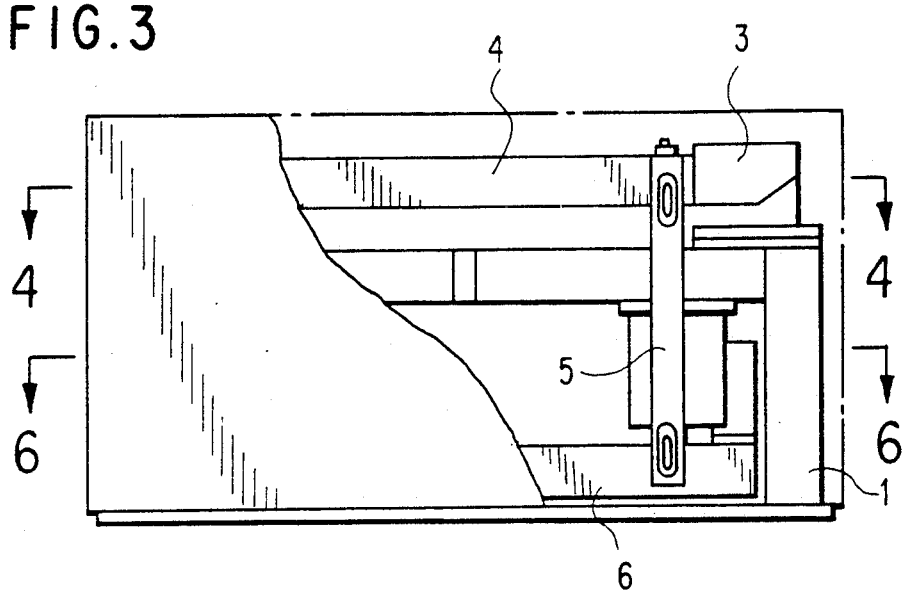
FIG. 3 is a side view of the support structure.
Figure 4:
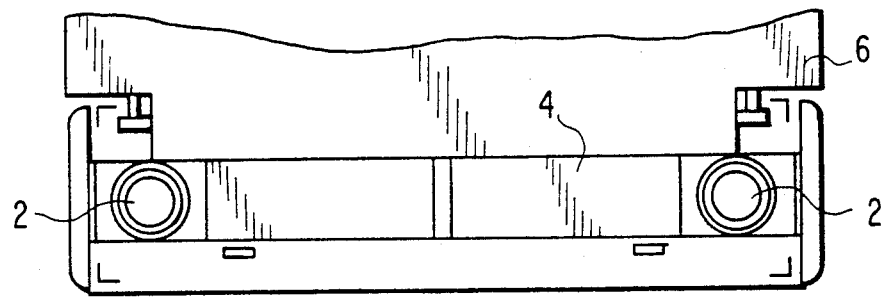
FIG. 4 is a section taken on line IV—IV of FIG. 3.

FIG. 1 is a plan view of an entire damping support structure accordig to the present invention. FIG. 2 is a front view of the support structure. FIG. 3 is a side view of the support structure. FIG. 4 is a section taken on line IV—IV of FIG. 3.

In these drawings, number 1 indicates stationary support columns erected at four selected positions on a floor. Each support column 1 carries a support member 3 attached to the top thereof through a first air spring 2 which is vertically extendible and contractible.

The four support members 3 form two pairs each interconnected by a connecting member 4. An apparatus table 6 is suspended from and supported by the support members 3 and connecting members 4 through suspenders 5 to be horizontally displaceable, with support positions of the first air springs 2 disposed above an apparatus mounting surface F of the apparatus table 6. Pin joints (not shown) are provided at connections 7 between the suspenders 5 and the support members 3/ connecting members 4 and between the suspenders 5 and the apparatus table 6. Each pin joint includes a pointed pin at one end, and a pin-receiving curved face at the other end thereof. This construction allows the apparatus table 6 to move in any two-dimensional horizontal directions.

Figure 5:
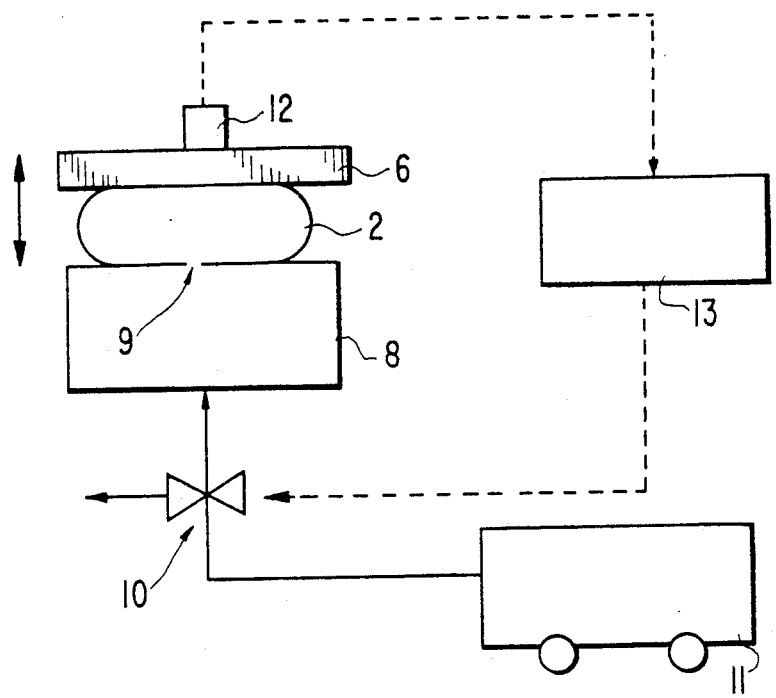
FIG. 5 is a schematic view illustrating a concept of damping vertical vibrations.

An air tank 8 is provided between each support column 1 and first air spring 2. As shown in FIG. 5 illustrating a vibration damping concept, inside spaces of the air tank 8 and the first air spring 2 communicate with each other through an orifice 9. The air tank 8 is connected through a servo valve 10 to a compressor 11 acting as air supply means. The apparatus tus table 6 carries sensors 12 for detecting vertical vibrations and transmitting a detection signal to a control unit 13. In response to this signal, the control unit 13 outputs a control signal to the servo valve 10. Thus, the first air springs 2 elastically support the apparatus table 6 to mitigate vibrations and to vertically displace the apparatus table 6 relative to the support columns 1. When the apparatus table 6 vibrates, the first air springs 2 are expanded or contracted to apply a dynamic force as a control force to the apparatus table 6, thereby maintaining the apparatus table 6 in an absolutely stationary state.

Figure 6:
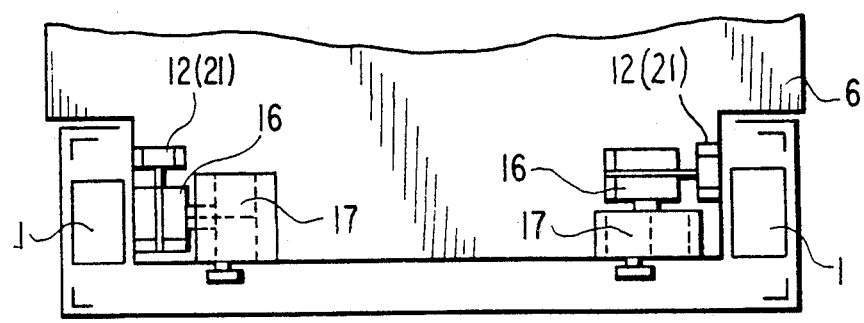
FIG. 6 is a view taken on line VI—VI of FIG. 3.
Figure 7:
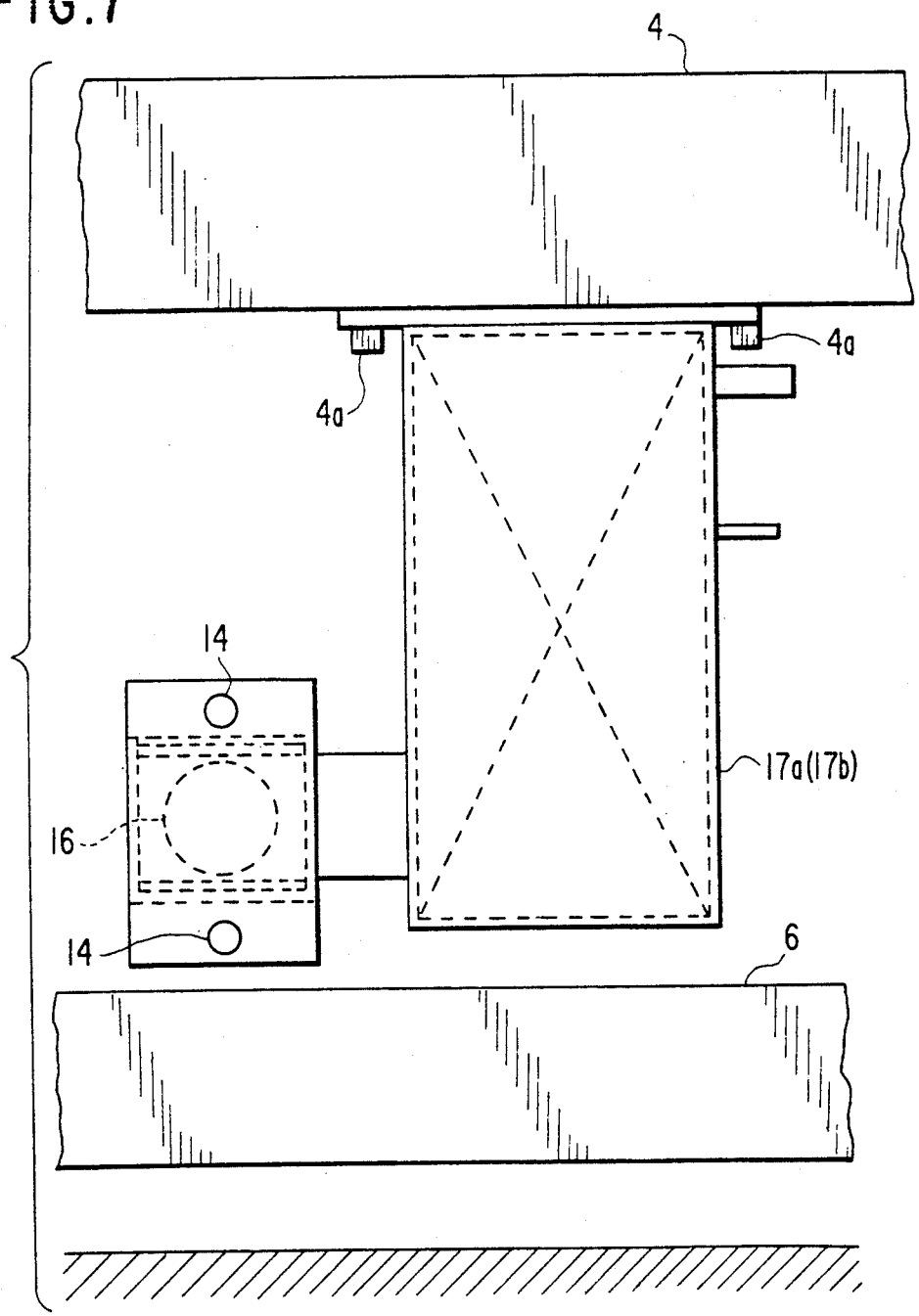
FIG. 7 is an enlarged front view of a principal section.
Figure 8:
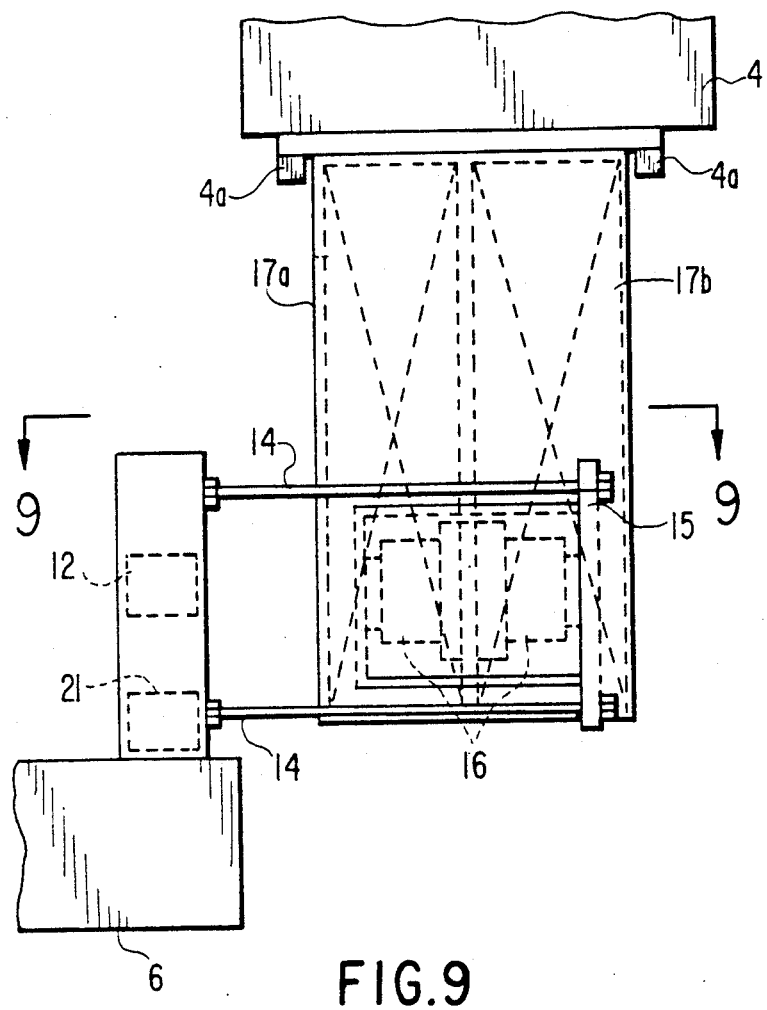
FIG. 8 is a side view of the principal section shown in FIG. 7.
Figure 9:
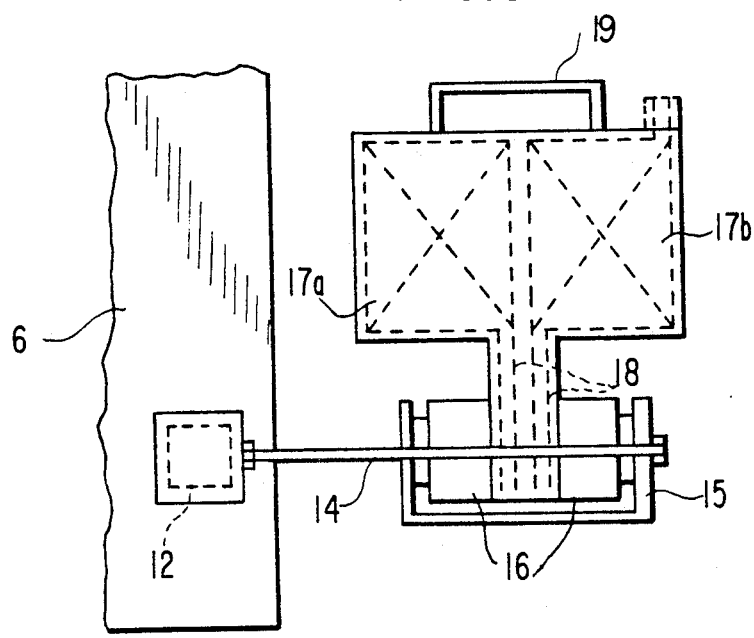
FIG. 9 is a section taken on line IX—IX of FIG. 7.

As shown in FIG. 6 (a section taken on line VI—VI of FIG. 3), FIG. 7 (an enlarged front view of a principal section), FIG. 8 (a side view of the principal section shown in FIG. 7), and FIG. 9 (a section taken on line IX—IX of FIG. 8), the apparatus table 6 carries frames 15 each attached thereto through a pair of rods 14, and each frame 15 contains a pair of second air springs 16 extendible and contractible in horizontal directions. The connecting members 4 carry air tank pairs 17a and 17b fixed to selected positions thereof by bolts 4a. Inside spaces of the air tanks 17a and 17b and the second air springs 16 communicate with each other through orifices 18.

Figure 10:
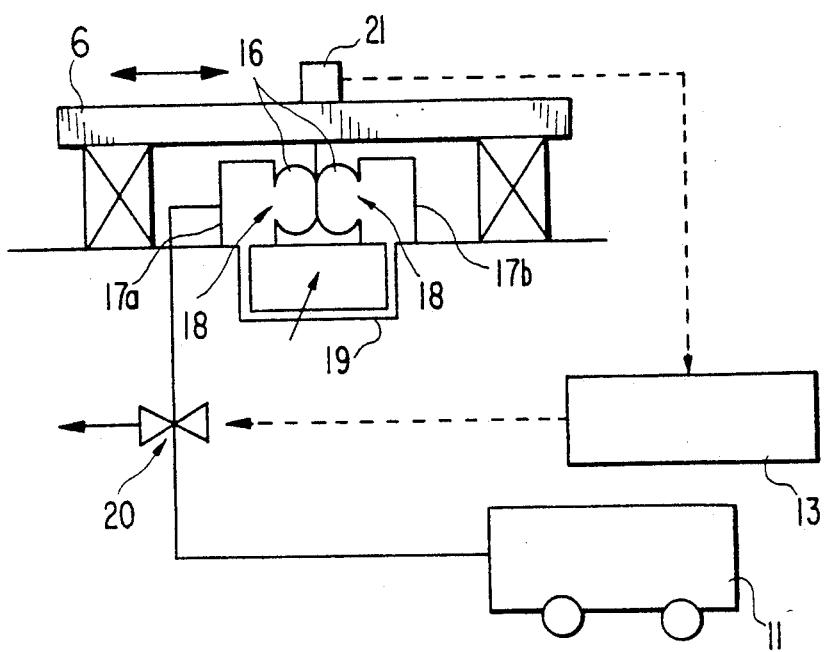
FIG. 10 is a schematic view illustrating a concept of damping horizontal vibrations.

The air tanks 17a and 17b forming a pair are interconnected by an orifice pipe 19. As shown in FIG. 10 illustrating a horizontal vibration damping concept, the compressor 11 is connected through a servo valve 20 to only one of the illustrated air tanks 17a. The apparatus table 6 carries sensors 21 for detecting horizontal vibrations and transmitting a detection signal to the control unit 13. In response to this signal, the control unit 13 outputs a control signal to the servo valve 20. Thus, the second air springs 16 elastically support the apparatus table 6 to mitigate vibrations and horizontally displace the apparatus table 6 relative to the support columns 1. When the apparatus table 6 vibrates, the second air springs 16 are expanded or contracted to apply a dynamic force to the apparatus table 6, thereby maintaining the apparatus table 6 in an absolutely stationary state.

FIG. 11 shows a vertical section of each of the servo valves 10 and 20 for controlling vertical and horizontal displacements of the apparatus table 6. As shown, each servo valve 10 or 20 includes a valve body 22 defining a passage R1 connected to the compressor 11, an air supply passage R2 connected to an air tank, and an exhaust passage R3. Flappers 23 are provided at a junction of the three passages to be electrically driven by solenoids 24 for varying sectional areas of the air supply passage R2 and exhaust passage R3 communicating with the passage R1 connected to the compressor 11, respectively. Electric current adjustably applied to the solenoids 24 has a linear proportional relationship with an amount of air supplied through the air tank 17a to the second air spring 16 as seen in the graph of FIG. 12 which shows a relationship between the electric current and volumetric air flow.

In controlling the horizontal displacement of the apparatus table 6, air is supplied to only one of the air tanks 17a and 17b forming a pair, the two air tanks 17a and 17b being interconnected through the orifice pipe 19. As the amount of air supplied to one air tank 17a is varied, a control pressure besides a static pressure will act in the air tank 17a, but only the static pressure will act in the other air tank 17b with the control pressure filtered by the orifice pipe 19. As a result, there occurs a differential pressure between the two air tanks 17a and 17b, the differential pressure being applied as the control pressure to the apparatus table 6.

Experiments have been carried out to confirm that the above construction is effective to apply the control force to the apparatus table 6. These experiments will be described next.

FIG. 13 is a graph showing results obtained by varying the frequency of vibration applied to the apparatus table 6. The curve A represents pressure variations occurring with the air supply control for one of the air tanks 17a. The internal pressure response of the other tank 17b was also checked. The curve B represents the response where the orifice pipe 19 had a 4 mm diameter, the curve C where the orifice pipe 19 had a 0.5 mm diameter, and the curve D where the orifice pipe 19 had a 0.3 mm diameter.

The results show that the responses are made while maintaining a substantially constant differential pressure (delta p) despite the vibration frequency variations. Clearly, the differential pressure produced by utilizing the orifice pipe 19 is capable of sufficiently controlling the apparatus table 6, which may suitably be employed in practicing the present invention. The smaller the inside diameter of the orifice pipe 19 is, the greater differential pressure is produced. It is thus evident that the diameter of the orifice pipe 19 may be selected as desired.

FIG. 14 is a schematic front view, partly broken away, of an air supply device according to another embodiment. FIG. 15 is a partly sectional enlarged view of a principal portion of the air supply device shown in FIG. 14. FIG. 16 is a section taken on line XVI—XVI of FIG. 15. This device comprises a piston 26 slidably mounted in a cylinder 25, and a voice coil type linear motor 27 operatively connected to the piston 26. The peripheral inside wall of the cylinder 25 and the piston 26 define a closed space S communicating in an airtight condition with the air tank 8 through an air pipe 28. The amount of air supplied to the air tank 8 is controlled by actuating the linear motor 27 to drive the piston 26, thereby adjusting the internal pressure of the first air spring 2.

Compression coil springs 29 acting as an auxiliary support mechanism are connected to the piston 26, to receive a static force transmitted from the first air spring 2, thereby elastically supporting the apparatus table 6.

In response to the signals from the vertical vibration sensors 12 affixed to the apparatus table 6, the control unit 13 outputs a control signal to the linear motor 27. Thus, the linear motor 27 is actuated when the apparatus table 6 vibrates vertically, to apply a dynamic force counteracting the vertical vibrations of the apparatus table 6. In other words, the apparatus table 6 is displaced relative to the floor W to remain absolutely stationary in the vertical directions.

The cylinder 25 includes a bottom wall 25a which supports the compression coil springs 29 and linear motor 27, and which defines air holes 30 for mitigating resistance to the sliding movement of the piston 26.

Although not shown, a plurality of cylinders 25 having the same construction are disposed at an appropriate position as a group. These cylinders 25 define inside spaces S communicating with the air tanks 8, respectively.

Similar cylinders 25 define inside spaces S communicating with the air tanks 17a, respectively. In response to the signals from the horizontal vibration sensors 21 affixed to the apparatus table 6, the control unit 13 outputs a control signal to the linear motor 27. Thus, the linear motor 27 is actuated when the apparatus table 6 vibrates horizontally, to apply a dynamic force counteracting the horizontal vibrations of the apparatus table 6. In other words, the apparatus table 6 is displaced relative to the floor W to remain absolutely stationary in the horizontal directions.

With the above construction, when the apparatus table 6 vibrates vertically or horizontally, the linear motors 27 are actuated in a controlled amount to control the amount of air supplied to the inside spaces of the first and second air springs 2 and 16 for adjusting the internal pressure thereof, thereby maintaining the apparatus table 6 in an absolutely stationary state. This construction has the following advantages over the preceding embodiment in which the compressors 11 are constantly driven and air is constantly exhausted from the servo valves 10:

(1) This embodiment consumes less power, and therefore its running cost is lower. Operating environment is improved by avoiding the noise and dust generation incidental to the constant drive and air exhaust.

(2) In manufacturing products in a cleanroom, defective products due to dust adhesion are reduced.

(3) The linear motors 27 may be installed remote from the apparatus table 6 by using the air pipes 28. Thus, various control devices mounted on the apparatus table 6 may readily be safeguarded against adverse influences of the magnetism produced by the linear motors 27, without employing special magnetic shields.

Figure 17:
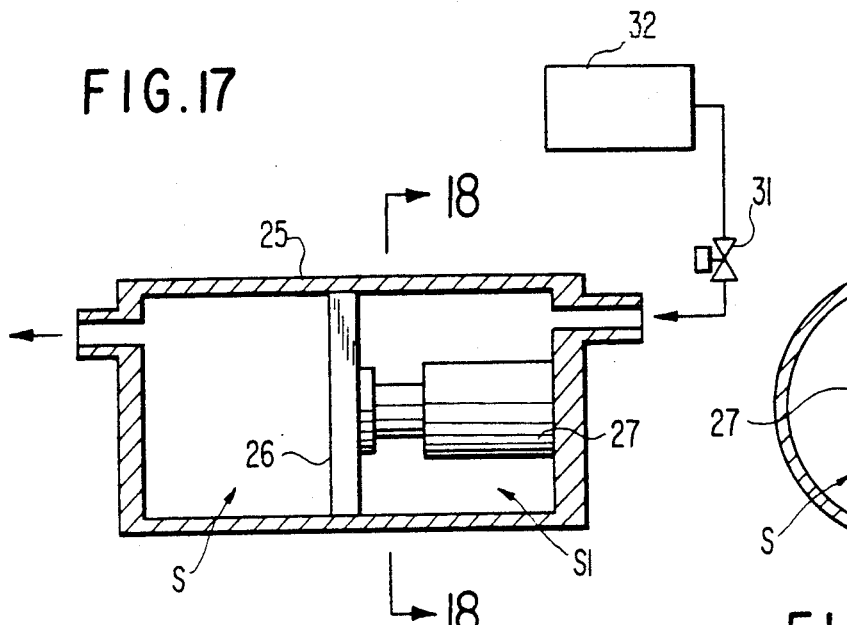
FIG. 17 is a partly sectional enlarged view of a principal portion of a modified auxiliary support mechanism.
Figure 18:
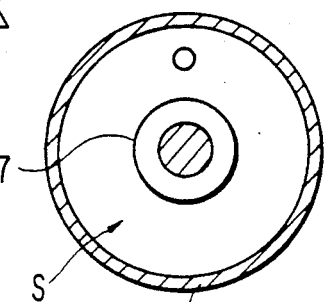
FIG. 18 is a section taken on line XVIII—XVIII of FIG. 17.

FIG. 17 is a partly sectional enlarged view of a principal portion of a modified auxiliary support mechanism. FIG. 18 is a section taken on line XVIII—XVIII of FIG. 17. In this construction, the cylinder 25 defines a closed inside space S1 in which the linear motor 27 is mounted and which communicates with a compressor 32 through a switch valve 31. The switch valve 31 is closed with a predetermined amount of air supplied to the closed space S1, thereby to use the air pressure for receiving the static force from the first and second air springs 2 and 16.

According to this construction, when there is a change in the weight of apparatus placed on the apparatus table 6, for example, the air pressure necessary for receiving the static force from the first and second air springs 2 and 16 may be varied with ease. It is also possible to carry out fine adjustment at an installation time with ease. This construction, therefore, has the advantage of facilitating adjustment of the support for receiving the static force.

Figure 19:
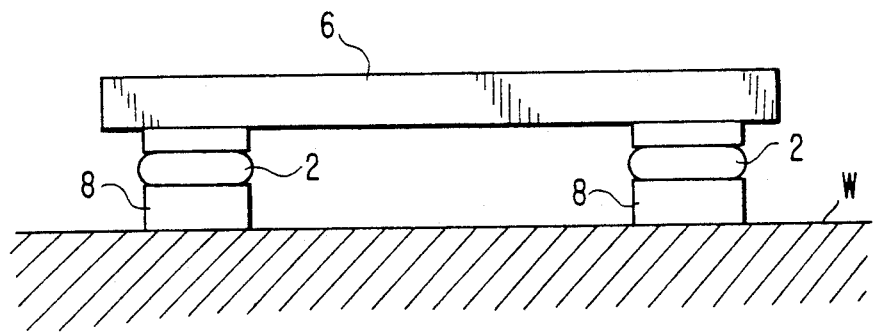
FIG. 19 is a side view of a different support structure.

The foregoing construction for actuating the piston 26 by means of the linear motor 27 to control the amount of air supplied to the inside spaces of the first and second air springs 2 and 16 is applicable not only to the support structure in which the apparatus table 6 is suspended from the support members 3 as described. It is also applicable to a support structure in which the apparatus table 6 is directly mounted on the air springs 2 supported on the air tanks 8 as shown in side view in FIG. 19.

Figure 20:
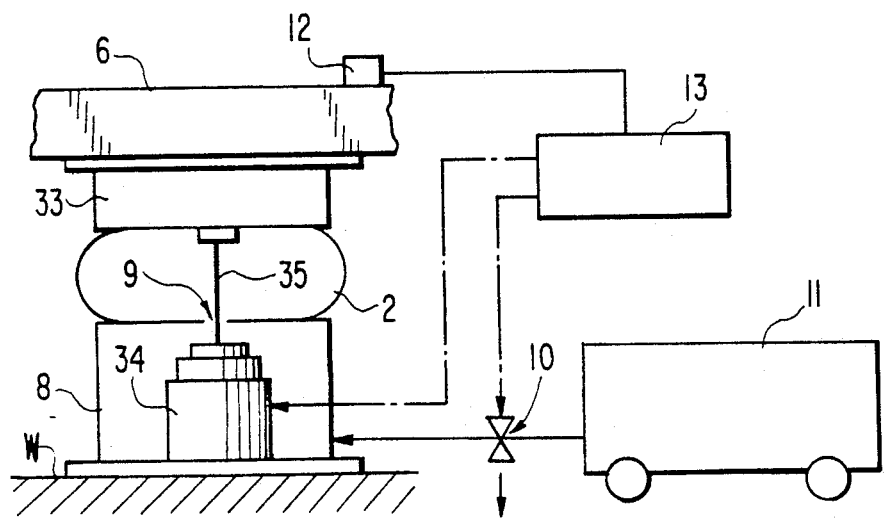
FIG. 20 is a schematic front view, partly broken away, of an improved example.

FIG. 20 is a schematic front view, partly broken away, of an improved example. This construction includes a first air spring 2 between a connecting member 33 connected to a support member 33 of the apparatus table 6 and an air tank 8 installed on the floor W. The first air spring 2 and air tank 8 communicate with each other through an orifice 9.

The air tank 8 houses a voice coil type linear motor 34 acting as an actuator. The linear motor 34 is operatively connected to the connecting member 33 by a linkage 35 extending through the orifice 9.

As in the foregoing embodiments, a compressor 11 is connected to the air tank 8 through a servo valve 10.

In response to a signal from a vertical vibration sensor 12, a control unit 13 outputs control signals to the servo valve 10 and linear motor 34. Thus, when the apparatus table 6 vibrates vertically, the opening degree of the servo valve 10 is adjusted to control the air supply to the inside space of the first air spring 2, and the linear motor 34 is actuated to apply a dynamic force to the apparatus table 6. Consequently, the apparatus table 6 is displaced relative to the floor W to remain absolutely stationary.

As noted above, the linear motor 34 is contained in the air tank 8, and the connecting member 33 fixed to the apparatus table 6 is connected to the linear motor 34. This construction has the advantages of significantly reducing assembly steps as compared with the case of assembling the first air spring 2 and the linear motor 34 in independent steps, and of requiring a reduced installation space which allows the damping support structure to be compact. Since the same connecting member 33 is used for damping and controlling the vibrations of the apparatus table 6, the apparatus table 6 having a rectangular shape in plan view, for example, may receive the vibration damping and controlling forces at the four corners thereof. This construction, therefore, is capable of effectively applying the supporting and controlling forces to the apparatus table 6 regardless of the shape of the apparatus table 6.

The linear motor 34 as described above, when used as the actuator for applying a dynamic force, has the advantage of excellent response. It is, however, possible to replace the linear motor 34 with a hydraulic cylinder.

What is claimed is:

1. A damping support structure having stationary members, an apparatus table, and air springs disposed between the stationary members and the apparatus table, said damping structure comprising:

support members supported by said stationary members through vertically extendible and contractible first air springs, said support members supporting said apparatus table in suspension to be displaceable horizontally, means for suspending said apparatus table from said support members with support positions of the first springs being disposed above an apparatus mounting surface of said apparatus table, horizontally extendible and contractible second air springs disposed between said stationary members and said apparatus table, air supply means communicating with inside spaces of said first and second air springs, respectively, vibrating sensors attached to said apparatus table, and control means operable in response to detections provided by said vibration sensors to control air supply from said air supply means to the inside spaces of said first and second air springs for counteracting vibrations of said apparatus table.

2. A damping support structure as claimed in claim 1, wherein said air supply means comprises compressors.

3. A damping support structure as claimed in claim 1, wherein said air supply means includes a cylinder having a piston slidably mounted therein, a linear motor for driving said piston, and an auxiliary support mechanism for receiving a static force applied to said piston, said piston and a peripheral inside wall of said cylinder defining a closed space communicating in an airtight manner with the inside space of said air spring.

4. A damping support structure as claimed in claim 2 or 3, wherein said apparatus table includes connecting members connected thereto, and each stationary member includes an air tank, an air spring being interposed between each of said connecting members and said air tank, said air spring communicating with said air tank through an orifice, said air tank housing an actuator connected to said connecting member by a linkage extending through said orifice.

* * * * *